(12) United States Patent
Eom

(10) Patent No.: US 11,960,179 B2
(45) Date of Patent: Apr. 16, 2024

(54) DISPLAY DEVICE AND METHOD OF MANUFACTURING DISPLAY DEVICE

(71) Applicant: Samsung Display Co., LTD., Yongin-si (KR)

(72) Inventor: Cheolhwan Eom, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 733 days.

(21) Appl. No.: 16/936,368

(22) Filed: Jul. 22, 2020

(65) Prior Publication Data

US 2021/0149085 A1 May 20, 2021

(30) Foreign Application Priority Data

Nov. 18, 2019 (KR) .......................... 10-2019-0147746

(51) Int. Cl.
  *G02F 1/1345* (2006.01)
  *G02F 1/16756* (2019.01)
  *G06F 1/16* (2006.01)
  *H10K 59/131* (2023.01)

(52) U.S. Cl.
  CPC ........ *G02F 1/13452* (2013.01); *G02F 1/1345* (2013.01); *G02F 1/16756* (2019.01); *G06F 1/1609* (2013.01); *H10K 59/131* (2023.02); *G02F 2201/503* (2013.01); *G02F 2202/28* (2013.01)

(58) Field of Classification Search
  CPC ............... G02F 1/1345; G02F 1/13452; G02F 1/13456; G02F 1/13458
  USPC .................................................. 349/149–152
  See application file for complete search history.

(56) References Cited

U.S. PATENT DOCUMENTS

| 6,356,334 B1* | 3/2002 | Mathew ............ G02F 1/133308 349/149 |
| 8,902,394 B2* | 12/2014 | Takenaka ............. H05K 3/4092 349/150 |
| 2010/0026662 A1* | 2/2010 | Oohira .................. G02F 1/1339 349/12 |
| 2016/0164030 A1* | 6/2016 | Yasuda ............... G02F 1/13458 349/122 |
| 2018/0198096 A1* | 7/2018 | Yasuda .................. H05B 33/02 |

FOREIGN PATENT DOCUMENTS

| KR | 10-0182021 | 5/1999 |
| KR | 10-0780573 | 11/2007 |
| KR | 10-0806997 | 2/2008 |
| KR | 10-1473470 | 12/2014 |

\* cited by examiner

*Primary Examiner* — Edward J Glick
*Assistant Examiner* — David Y Chung
(74) *Attorney, Agent, or Firm* — H.C. Park & Associates, PLC

(57) ABSTRACT

A display device includes a protective film, a display panel, and a conductive film package. The protective film has a first area, a second area, and a third area positioned between the first area and the second area. The display panel is disposed in the first area and the third area on the protective film. The conductive film package is disposed on the display panel, and is in contact with the protective film positioned in the second area. In this manner, a defect of the substrate included in the display panel and a defective adhesion between the conductive film package and the display panel may be avoided.

14 Claims, 11 Drawing Sheets

DISPLAY DEVICE AND METHOD OF MANUFACTURING DISPLAY DEVICE

CROSS REFERENCE TO RELATED APPLICATION

This application claims priority from and the benefit of Korean Patent Application No. 10-2019-0147746 filed on Nov. 18, 2019, which is hereby incorporated by reference for all purposes as if fully set forth herein.

BACKGROUND

Field

Exemplary embodiments/implementations of the invention relate generally to display device and a method of manufacturing the display device and, more specifically, to a display device including a conductive film package and a method of manufacturing the display device including the conductive film package.

Discussion of the Background

Flat panel display devices are used as display devices for replacing cathode ray tube display devices due to being lightweight and thin. As representative examples of such flat panel display devices, there are liquid crystal display devices and organic light emitting diode display devices.

The display device may include a display panel including a display area and a pad area, and pad electrodes electrically connected to an external device may be arranged to be spaced apart from each other in the pad area of the display panel. In addition, the display device may include bump electrodes positioned to overlap the pad electrodes, and may further include a flexible printed circuit board (such as chip-on-film) electrically connected to an external device generating signals and an anisotropic conductive film disposed between the flexible circuit board and the pad electrodes. The anisotropic conductive film may bond the pad electrodes to the flexible printed circuit board, and the pad electrodes may be electrically connected to the bump electrodes through a conductive ball included in the anisotropic conductive film.

The above information disclosed in this Background section is only for understanding of the background of the inventive concepts, and, therefore, it may contain information that does not constitute prior art.

SUMMARY

According to one or more exemplary embodiments of the invention, a display device includes a conductive film package.

According to yet another one or more exemplary embodiments of the invention, a method of manufacturing the display device includes the conductive film package.

Additional features of the inventive concepts will be set forth in the description which follows, and in part will be apparent from the description, or may be learned by practice of the inventive concepts.

According to one or more exemplary embodiments, a display device includes a protective film, a display panel, and a conductive film package. The protective film has a first area, a second area, and a third area positioned between the first area and the second area. The display panel is disposed in the first area and the third area on the protective film. The conductive film package is disposed on the display panel, and is in contact with the protective film positioned in the second area.

In exemplary embodiments, the display panel may not be disposed in the second area.

In exemplary embodiments, the display panel may include a substrate overlapping the first and third areas, a pixel disposed in the first area on the substrate, and a pad electrode disposed in the third area on the substrate.

In exemplary embodiments, the pad electrode may not overlap the protective film positioned in the second area.

In exemplary embodiments, one side surface of the pad electrode may be aligned with a boundary between the second area and the third area.

In exemplary embodiments, the protective film may include a protective layer overlapping the first, second and third areas and an adhesive layer disposed in the first and third areas between the protective layer and the substrate.

In exemplary embodiments, the adhesive layer may not be disposed in the second area.

In exemplary embodiments, one side surface of the pad electrode, one side surface of the substrate, and one side surface of the adhesive layer may be aligned with a boundary between the second area and the third area.

In exemplary embodiments, the adhesive layer may expose a part of a top surface of the protective layer and a part of a bottom surface of the substrate positioned in the third area.

In exemplary embodiments, one side surface of the pad electrode and one side surface of the substrate may be aligned with a boundary between the second area and the third area, and one side surface of the adhesive layer may be spaced apart from the boundary in a direction from the second area to the third area.

In exemplary embodiments, the conductive film package may include a base substrate disposed on the pad electrode, a bump electrode disposed on a bottom surface of the base substrate to overlap the pad electrode, a protective insulating layer disposed on a bottom surface of the bump electrode to expose a first portion of the bump electrode, and a conductive layer disposed between the first portion of the bump electrode and the pad electrode.

In exemplary embodiments, the first portion of the bump electrode may be portioned to overlap the third area and a part of the second area.

In exemplary embodiments, the conductive layer may cover the first portion of the bump electrode.

In exemplary embodiments, the conductive layer may be in contact with a side surface of the pad electrode, a side surface of the substrate, and a side surface of the adhesive layer at the boundary between the second area and the third area.

In exemplary embodiments, the protective insulating layer may be spaced apart from the pad electrode and the protective layer positioned in the second area, and the conductive layer may be disposed in a space where the protective insulating layer is spaced apart from the pad electrode and protective layer.

In exemplary embodiments, the conductive layer may be in contact with a part of the protective insulating layer overlapping the second area and a top surface of the protective layer overlapping the second area.

In exemplary embodiments, the conductive layer may be in contact with a side surface of the pad electrode and a side surface of the substrate at a boundary between the second area and the third area, and the conductive layer may be spaced apart from a side surface of the adhesive layer.

In exemplary embodiments, the conductive film package may further include a driving integrated circuit disposed on a bottom surface of the base substrate and connected to the bump electrode.

According to one or more exemplary embodiments, a method of manufacturing a display device is provided wherein a display panel having a first area, a second area, and a third area positioned between the first area and the second area is provided. A protective film is formed on a bottom surface of the display panel. The protective film positioned in the second area is exposed by removing the display panel positioned in the second area. A conductive film package is disposed in a part of the third area on the display panel and in the second area on the protective film.

In exemplary embodiments, the conductive film package may be in contact with the protective film positioned in the second area.

In the display device according to the exemplary embodiments of the inventive concepts, the display panel is disposed only in the first area and the third area to expose the protective film positioned in the second area, so that the conductive film package may be in contact with the exposed protective film. Accordingly, the defect of the substrate included in the display panel and the defective adhesion between the conductive film package and the display panel may not occur.

In the method of manufacturing the display device according to the exemplary embodiments of the inventive concepts, since the adhesive layer, the substrate, and the pad electrode are removed from the second area on the protective layer, the pad electrode may be spaced apart from the first protective insulating layer, and an empty space may be defined between the pad electrode and the first protective insulating layer. While the heating member applies pressure onto the conductive film package in the third direction and thus the uncured conductive layer reflows, the uncured conductive layer may pass through the empty space defined between the pad electrode and the first protective insulating layer and be formed on the protective layer positioned in the second area. In other words, while the uncured conductive layer reflows, the pressure may not increase between the pad electrode and the bump electrode due to the empty space. Accordingly, cracks may not be generated in the substrate, and a defective adhesion may be avoided between the conductive film package and the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
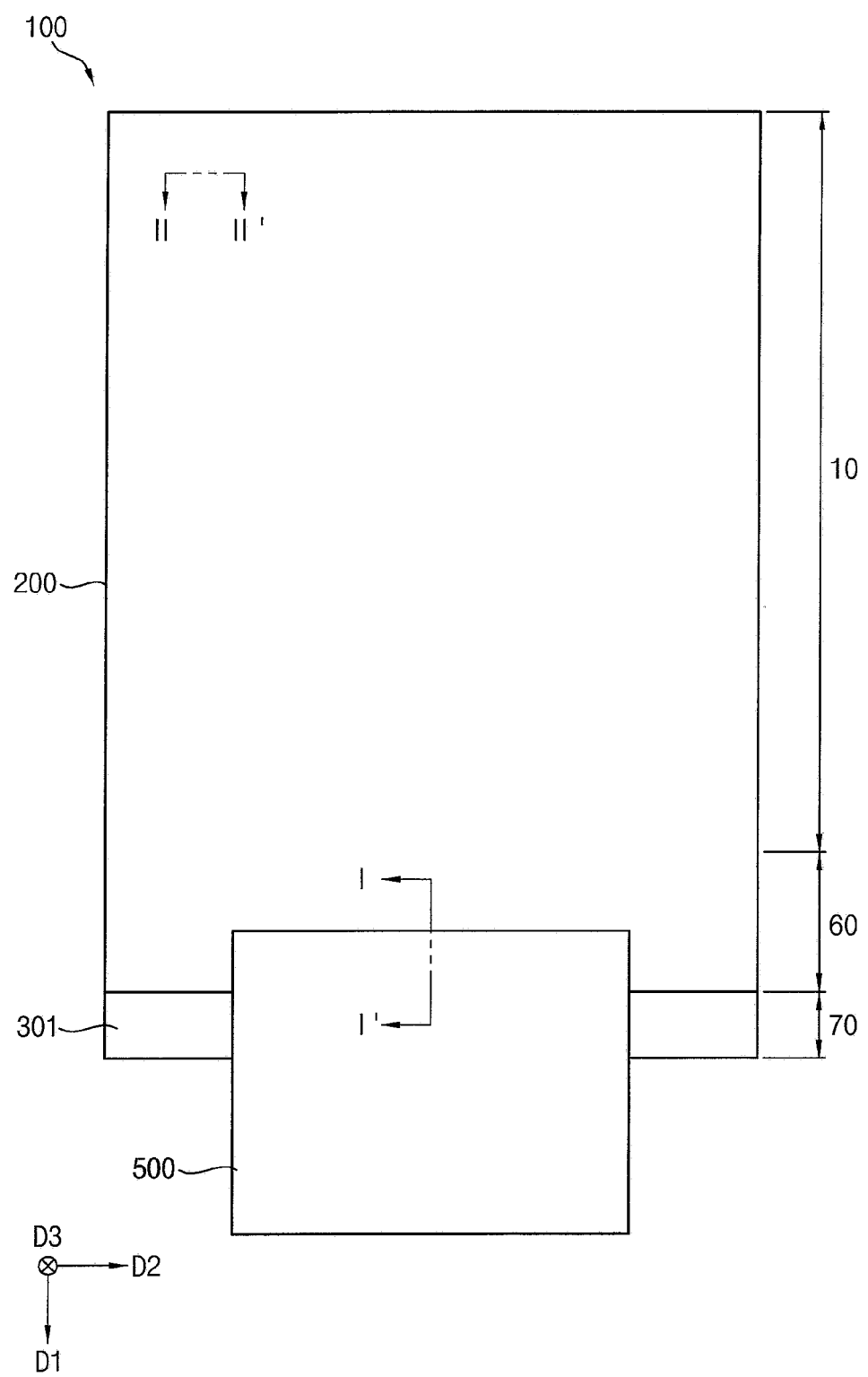
FIG. 1 is a plan view showing a display device according to exemplary embodiments of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1/D4-axis, the D2-axis, and the D3-axis are not limited to three axes of a rectangular coordinate system, such as the x, y, and z-axes, and may be interpreted in a broader sense. For example, the D1/D4-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
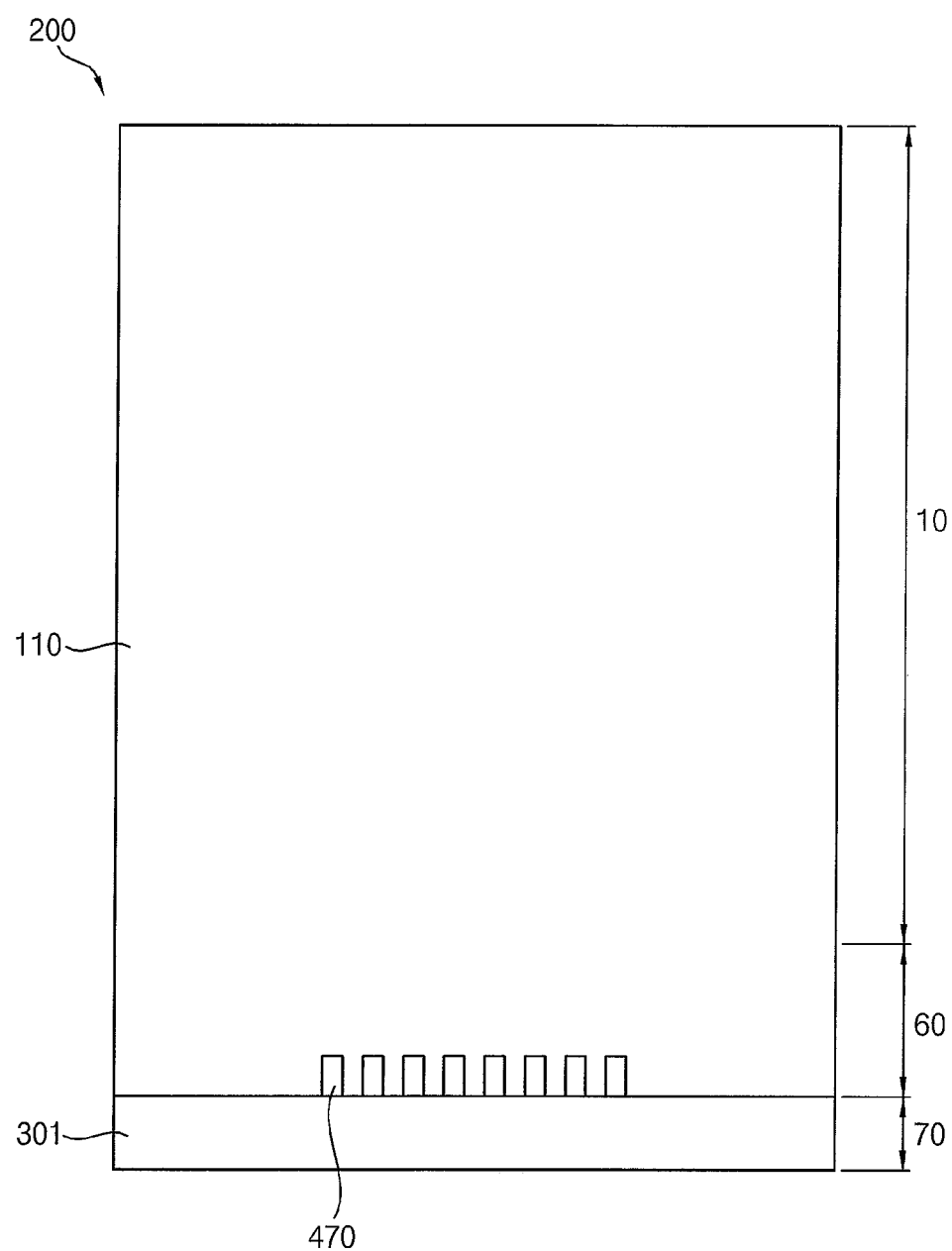
FIG. 2 is a plan view showing pad electrodes included in the display device of FIG. 1.
Figure 2:
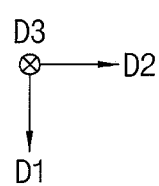
Figure 3:
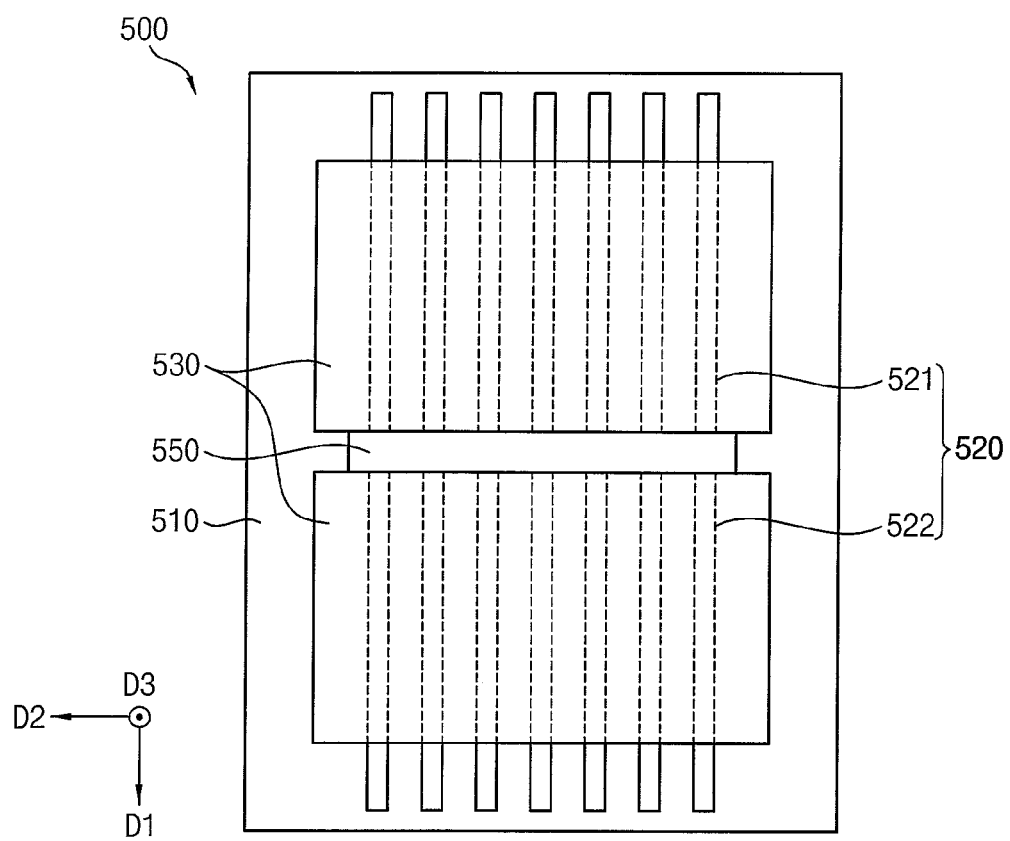
FIG. 3 is a plan view showing a rear side of a conductive film package included in the display device of FIG. 1.
Figure 4:
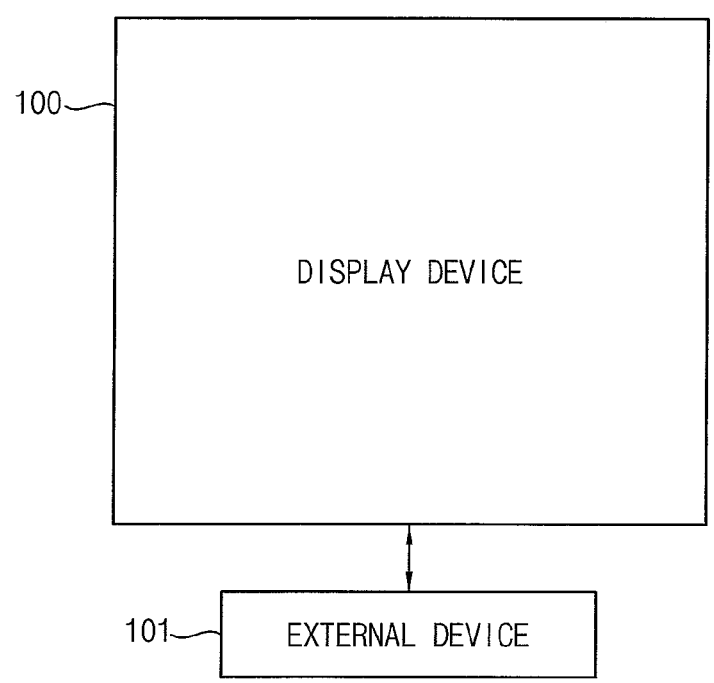
FIG. 4 is a block diagram illustrating an external device electrically connected to the display device.
Figure 5:
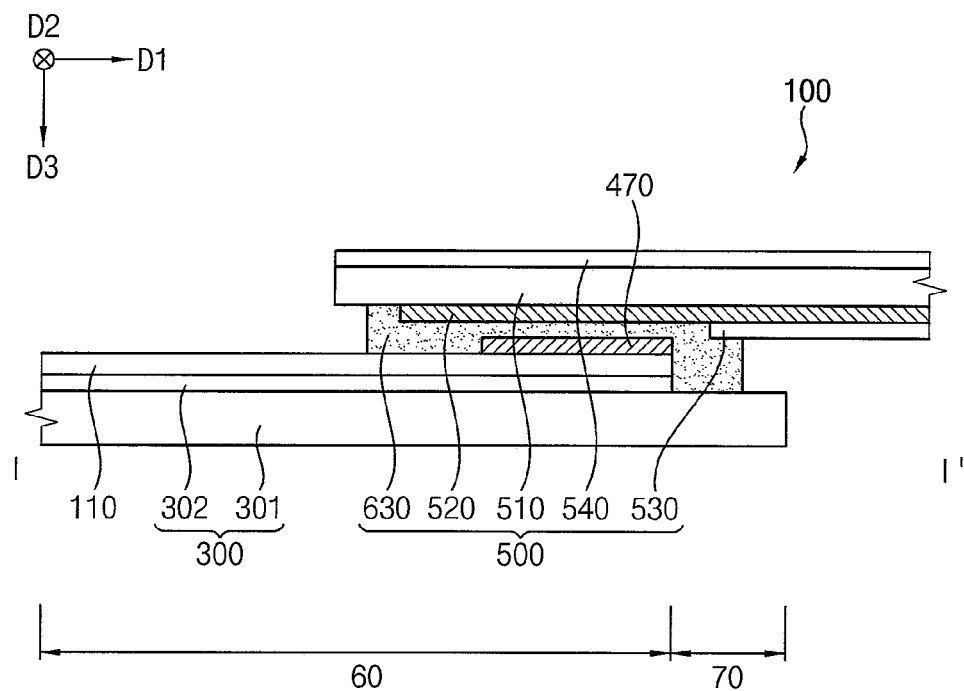
FIG. 5 is a cross-sectional view taken along line I-I' of FIG. 1.

FIG. 1 is a plan view showing a display device according to exemplary embodiments of the inventive concepts. FIG. 2 is a plan view showing pad electrodes included in the display device of FIG. 1. FIG. 3 is a plan view showing a rear side of a conductive film package included in the display device of FIG. 1. FIG. 4 is a block diagram illustrating an external device electrically connected to the display device. FIG. 5 is a cross-sectional view taken along line I-I' of FIG. 1.

Referring to FIGS. 1, 2, 3, 4, and 5, the display device 100 may include a display panel 200, a protective film 300, a conductive film package 500, and the like. The display panel 200 may include a substrate 110, a pad electrode 470 and the like, and the protective film 300 may include a protective layer 301 and an adhesive layer 302. In addition, the conductive film package 500 may include a base substrate 510, a bump electrode 520, a first protective insulating layer 530, a second protective insulating layer 540, a conductive layer 630 and a driving integrated circuit 550, and the bump electrode 520 may include an upper bump electrode 521 and a lower bump electrode 522.

As shown in FIG. 1, the display device 100 may have a first area 10, a second area 70 and a third area 60. For example, the first area 10 may correspond to a display area in which an image is displayed, and the third area 60 may correspond to a non-display area or a pad area in which the pad electrode 470 is disposed. In addition, the second area 70 may correspond to a removal area in which a part of the display panel 200 is removed on the protective film 300.

As the display device 100 has the first area 10, the second area 70 and the third area 60, the protective film 300 may also be divided into a first area 10, a second area 70 and a third area 60. The second area 70 may be positioned spaced apart from the first area 10 in a first direction D1, and the third area 60 may be positioned between the first area 10 and the second area 70. The first direction D1 may be a direction from the first area 10 to the second area 70 or a direction parallel to a top surface of the display device 100. In exemplary embodiments, the display panel 200 may be disposed in the first area 10 and the third area 60 on the protective film 300, and may not be disposed in the second area 70. In other words, the display panel 200 may expose the protective film 300 (for example, the protective layer 301) positioned in the second area 70. In addition, the conductive film package 500 may be disposed on the display panel 200, and the conductive layer 630 included in the conductive film package 500 may be in contact with the protective film 300 (for example, the protective layer 301) positioned in the second area 70. In other words, the conductive film package 500 may be disposed on the display panel 200 and the protective layer 301 exposed by the display panel 200, and may be in contact with the exposed protective layer 301.

As shown in FIG. 2, the pad electrode 470 may be disposed in the third area 60 on the substrate 110, which is positioned to overlap the first area 10 and the third area 60. For example, the pad electrode 470 may include a plurality of pad electrodes, and the pad electrodes may be arranged to be spaced apart from each other in a second direction D2 orthogonal to the first direction D1. In exemplary embodiments, the pad electrode 470 does not overlap the protective film 300 (for example, the protective layer 301) positioned in the second area 70. In addition, one side surface of the pad electrode 470 may be aligned with a boundary between the second area 70 and the third area 60.

As shown in FIGS. 3 and 4, the driving integrated circuit 550 may be disposed at a central portion on a bottom surface of the base substrate 510. The driving integrated circuit 550 may receive an input signal (for example, a data signal) and a driving integrated circuit power supply voltage from an external device 101 of FIG. 4, and the driving integrated circuit 550 may provide an output signal to the display panel 200 based on the input signal. Accordingly, the driving integrated circuit 550 may control a driving of the display panel 200. The driving integrated circuit 550 may be electrically connected to the bump electrode 520. In other exemplary embodiments, the driving integrated circuit 550 may be mounted in the third area 60 of the substrate 110.

In addition, the bump electrode 520 connected to the driving integrated circuit 550 may be disposed on the bottom surface of the base substrate 510. For example, the bump electrode 520 may include a plurality of bump electrodes, and the bump electrodes may be arranged spaced apart from each other in the second direction D2 on the base substrate 510. The upper bump electrode 521 may extend in a direction opposite to the first direction D1 from a first side surface of the driving integrated circuit 550, and the lower bump electrode 522 may extend in the first direction D1 from a second side opposite to the first side surface of the driving integrated circuit 550. A first portion of the upper bump electrode 521 may be exposed by the first protective insulating layer 530, and the first portion of the upper bump electrode 521 may overlap the pad electrode 470. A second portion opposite to the first portion of the upper bump electrode 521 may be covered by the first protective insulating layer 530, and the second portion of the upper bump electrode 521 may be connected to the first side surface of the driving integrated circuit 550. In addition, a first portion of the lower bump electrode 522 may be exposed by the first protective insulating layer 530, and the first portion of the lower bump electrode 522 may be electrically connected to the external device 101. A second portion opposite to the first portion of the lower bump electrode 522 may be covered by the first protective insulating layer 530, and the second portion of the lower bump electrode 522 may be connected to the second side surface of the driving integrated circuit 550.

Referring back to FIG. 5, the protective layer 301 having a first area, a second area, and a third area may be provided. The protective layer 301 may protect the display panel 200 from an external impact. The protective layer 301 may include polyethylene terephthalate (PET), polyethylene naphthalate (PEN), polypropylene (PP), polycarbonate (PC), polystyrene (PS), polysulfone (PSU), polyethylene (PE), polyphthalamide (PPA), polyether sulfone (PES), polyarylate (PAR), polycarbonate oxide (PCO), modified polyphenylene oxide (MPPO), polyimide (PI), and the like.

The adhesive layer 302 may be disposed in the first area 10 and the third area 60 on the protective layer 301. In other words, the adhesive layer 302 may be disposed in the first area 10 and the third area 60 between the protective layer 301 and the substrate 110. The adhesive layer 302 may bond the substrate 110 (for example, the display panel 200) to the protective layer 301. In exemplary embodiments, the adhesive layer 302 may not be disposed in the second area 70 on the protective layer 301, and may expose the protective layer 301 positioned in the second area 70. In addition, one side surface of the adhesive layer 302 may be aligned to the boundary between the third area 60 and the second area 70. The adhesive layer 302 may include an optical clear adhesive (OCA), a pressure sensitive adhesive (PSA) or the like including an acrylic-based adhesive, a silicone-based adhesive, a urethane-based adhesive, a rubber-based adhesive, a vinyl ether-based adhesive, or the like.

The substrate 110 may be disposed on the adhesive layer 302. In other words, the substrate 110 may be disposed in the first area 10 and the third area 60 on the adhesive layer 302. The substrate 110 may include a transparent or opaque material. In exemplary embodiments, the substrate 110 may be formed of a transparent resin substrate having flexibility. An example of the transparent resin substrate that can be used for the lower substrate 110 includes a polyimide substrate. In this case, the polyimide substrate may include a first polyimide layer, a barrier film layer, a second polyimide layer, and the like.

When the substrate 110 includes the polyimide substrate, the display device 100 may further include a bending area positioned in a part of the third area 60, and the conductive film package 500 may include a printed circuit board (PCB) or the like. For example, the bending area may be bent about an axis extending in the second direction D2, and may be positioned on a rear side of the protective layer 301 such that remaining portion of the third area 60 except for the bending area and the second area 70 overlaps the first area 10. The protective film 300 may not be disposed on a bottom surface of the display panel 200 positioned in the bending area, such that the display panel 200 positioned in the bending area is easily bent. In addition, the conductive film package 500 may be connected to the external device 101 and fixed to the rear side of the protective layer 301.

In other exemplary embodiments, the substrate 110 may include a quartz substrate, a synthetic quartz substrate, a calcium fluoride substrate, a fluorine-doped (F-doped) quartz substrate, a soda-lime glass substrate, a non-alkali glass substrate, and the like.

When the substrate 110 includes a glass substrate, the conductive film package 500 may include a flexible printed circuit board (FPCB), a flexible flat cable FFC and the like. For example, the FPCB may be bent about an axis extending in the second direction D2, and the external device 101 connected to the FPCB may be fixed to the rear side of the protective layer 301.

A pixel (for example, the pixel PX in FIG. 6) may be disposed in the first area 10 on the substrate 110. An outermost portion of the first area 10 may be defined as a peripheral area. Wirings (such as gate signal wiring, data signal wiring, gate initialization signal wiring, initialization voltage wiring, light emission control signal wiring, and power supply voltage wiring) may be disposed in the peripheral area on the substrate 110. First portions of the wirings may be electrically connected to the pixel PX, and second portions opposite to the first portions of the wirings may be electrically connected to the pad electrodes 470. Selectively, a gate driver or the like may be disposed in the peripheral area.

The pad electrode 470 may be disposed in the third area 60 on the substrate 110. In exemplary embodiments, the one side surface of the substrate 110, the one side surface of the adhesive layer 302, and the one side surface of the pad electrode 470 may be aligned to the boundary between the third area 60 and the second area 70, and the pad electrode 470 may overlap the bump electrode 520. In addition, the pad electrode 470 may not overlap the protective layer 301 positioned in the second area 70, and the pad electrode 470 may be covered by the conductive layer 630. In addition, during manufacturing the display device 100, the pad electrode 470 may be spaced apart from the first protective insulating layer 530, and the conductive layer 630 may pass through a space defined between the pad electrode 470 and the first protective insulating layer 530 and be disposed on the protective layer 301 positioned in the second area 70.

The pad electrode 470 may include a metal, an alloy, a metal nitride, a conductive metal oxide, a transparent conductive material, and the like. For example, the pad electrode 470 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, aluminum nitride (AlN), an alloy containing silver, tungsten nitride (WN), an alloy containing copper, an alloy containing molybdenum, titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), and the like. These may be used individually or in combination. In other exemplary embodiments, the pad electrode 470 may have a multi-layer structure including a plurality of metal layers. For example, the metal layers may have different thicknesses or include different materials.

The base substrate 510 may be disposed on the pad electrode 470. The base substrate 510 may be a flexible film including a flexible material. For example, the base substrate 510 may be a flexible film including PI, acrylic, polyether nitrile, PES, PET, PEN, polyvinyl chloride (PVC), and the like.

The bump electrode 520 (for example, the upper bump electrode 521 in FIG. 3) may be disposed to overlap the pad electrode 470 on the bottom surface of the base substrate 510. In exemplary embodiments, the first portion of the bump electrode 520 may be positioned to overlap a part of the second area 70 and the third area 60, and the second portion of the bump electrode 520 may be positioned to overlap the first protective insulating layer 530. The bump electrode 520 may include a metal, an alloy, a metal nitride, a conductive metal oxide, a transparent conductive material, and the like. These may be used individually or in combination. In other exemplary embodiments, the bump electrode 520 may have a multi-layer structure including a plurality of metal layers. For example, the metal layers may have different thicknesses or include different materials.

The first protective insulating layer 530 may be disposed such that the first portion of the bump electrode 520 is exposed on the bottom surface of the bump electrode 520. In exemplary embodiments, the first protective insulating layer 530 may be spaced apart from the pad electrode 470 and the protective layer 301 positioned in the second area 70, and the conductive layer 630 may be disposed in the separated space. The first protective insulating layer 530 may include a solder resist.

For example, in the conventional display device, the pad electrode 470, the substrate 110, and the adhesive layer 302 may also be disposed in the second area 70, and the first protective insulating layer 530 may be in contact with the pad electrode 470. In the manufacturing process of the conventional display device, a heating member (for example, the heating member 750 in FIG. 12) may be in contact with a top surface of a conductive film package 500. The heating member 750 may be heated to a predetermined temperature, and may apply pressure onto the conductive film package 500 in a third direction D3 perpendicular to the first direction D1 and the second direction D2 (for example, from the conductive film package 500 to the protective film 300). In this case, as a gap between the bump electrode 520 and the pad electrode 470 becomes narrow due to the pressure, an uncured conductive layer 630 may reflow, and the uncured conductive layer 630 is cured by the heat so that the conductive film package 500 may be bonded to the display panel 200. However, since the pad electrode 470 is in contact with the first protective insulating layer 530 while the uncured conductive layer 630 reflows, the pressure increases between the pad electrode 470 and the bump electrode 520, and thus cracks are generated in the substrate 110 due to the uncured conductive layer 630 or a defective adhesion occurs between the conductive film package 500 and the display panel 200.

In exemplary embodiments of the inventive concepts, the adhesive layer 302, the substrate 110, and the pad electrode 470 may not be disposed in the second area 70 of the display device 100. Accordingly, the pad electrode 470 may be spaced apart from the first protective insulating layer 530, and an empty space may be defined between the pad electrode 470 and the first protective insulating layer 530. In the manufacturing process of the display device 100 of the inventive concepts, while the heating member 750 applies pressure to the conductive film package 500 in the third direction D3 and thus the uncured conductive layer 630 reflows, the uncured conductive layer 630 may pass through the empty space defined between the pad electrode 470 and the first protective insulating layer 530 and be disposed on the protective layer 301 positioned in the second area 70. In other words, while the uncured conductive layer 630 reflows, the pressure may not increase between the pad electrode 470 and the bump electrode 520 due to the empty space. Accordingly, the cracks may not be generated in the substrate 110, and the defective adhesion may not occur between the conductive film package 500 and the display panel 200.

The second protective insulating layer 540 may be disposed on the base substrate 510. The second protective insulating layer 540 may protect the top surface of the base substrate 510. The second protective insulating layer 540 may include substantially the same material as the first protective insulating layer 530.

The conductive layer 630 may be disposed between the first portion of the bump electrode 520 and the pad electrode 470, and the conductive layer 630 may cover the first portion of the bump electrode 520. In exemplary embodiments, the conductive layer 630 may be in direct contact with a part of the bottom surface of the base substrate 510 positioned overlapping the third area 60, the first portion of the bump electrode 520 and a part of the first protective insulating layer 530 overlapped in the second area 70 so as to prevent the first portion of the bump electrode 520 from being exposed. In addition, the conductive layer 630 may be in direct contact with the side surface of the pad electrode 470, the side surface of the substrate 110 and the side surface of the adhesive layer 302 at the boundary between the second area 70 and the third area 60. Further, the conductive layer 630 may be in contact with the top surface of the protective layer 301 positioned overlapped in the second area 70. As described above, the conductive film package 500 may be bonded to the display panel 200 by the conductive layer 630. The conductive layer 630 may include thermosetting resin or photo-curable resin. For example, the conductive layer 630 may include epoxy resin, amino resin, phenol resin, urea resin, melamine resin, unsaturated polyester resin, polyurethane resin, polyimide resin, and the like.

Conductive balls may be disposed inside the conductive layer 630. The conductive balls may be in direct contact with each other between the bump electrode 520 and the pad electrode 470, and may electrically connect the bump electrode 520 to the pad electrode 470. Each of the conductive balls may have a structure in which a spherical polymer is coated with a metal layer such as Ni, cobalt (Co), Au, Ag, or Cu. For example, the conductive layer 630 disposed therein with the conductive balls may include an anisotropic conducting film (ACF) or the like.

Accordingly, the conductive film package 500, which includes a base substrate 510, a bump electrode 520, a first protective insulating layer 530, a second protective insulating layer 540, a conductive layer 630 and a driving integrated circuit 550, may be disposed. The external device 101 may generate a gate signal, a data signal, a gate initialization signal, an initialization voltage, a light emission control signal, and a power supply voltage, and the gate signal, the data signal, the gate initialization signal, the initialization voltage, the light emission control signal, and the power supply voltage may be provided to the pixel PX through the conductive film package 500, the pad electrode 470 and the wirings.

Although each of the display panel 200 and the conductive film package 500 has been described as having a rectangular plane shape, the shape is not limited thereto. For example, the shape may have a triangular plane shape, a circular plane shape, an oval plane shape, a rhombus plane shape, a polygonal plane shape, or a track-like plane shape.

In the display device 100 according to the exemplary embodiments of the inventive concepts, the display panel 200 is disposed only in the first area 10 and the third area 60 to expose the protective film 300 positioned in the second area 70, so that the conductive film package 500 may be in contact with the exposed protective film 300. Accordingly, the defect of the substrate 110 included in the display panel 200 and the defective adhesion between the conductive film package 500 and the display panel 200 may not occur.

Figure 6:
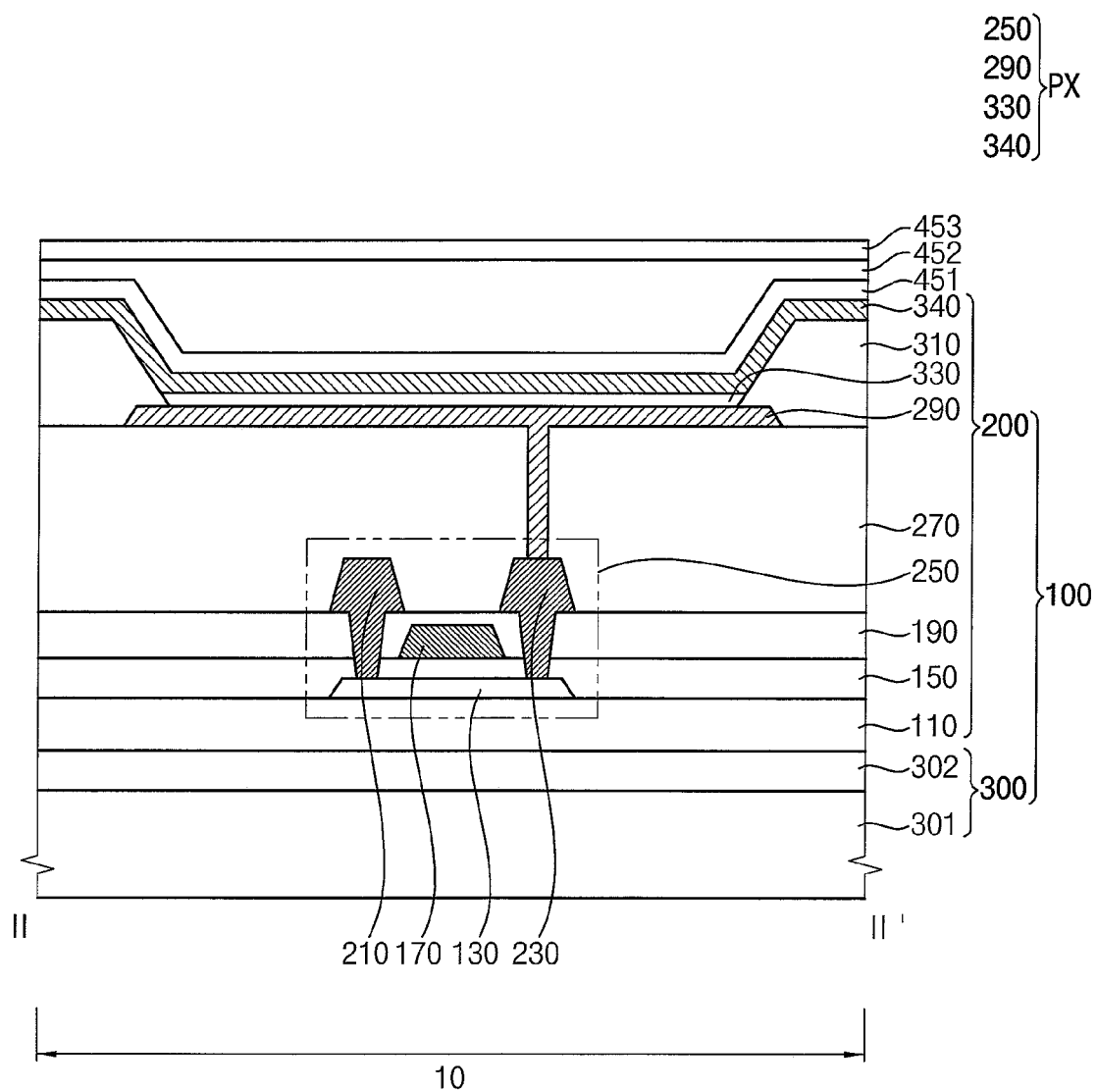
FIG. 6 is a cross-sectional view taken along line II-II' of FIG. 1.

FIG. 6 is a cross-sectional view taken along line II-II' of FIG. 1.

Referring to FIG. 6, the display panel 200 may include a substrate 110, a semiconductor element 250, a planarization layer 270, a pixel defining layer 310, a pixel PX, a first inorganic thin film encapsulation layer 451, an organic thin film encapsulation layer 452, a second inorganic thin film encapsulation layer 453, and the like. The semiconductor element 250 may include the active layer 130, the gate insulating layer 150, the gate electrode 170, the insulating interlayer 190, the source electrode 210 and the drain electrode 230. In addition, the pixel PX may include a lower electrode 290, a light emitting layer 330, and an upper electrode 340.

The substrate 110 may be disposed in the first area 10 on the protective film 300 (for example, the adhesive layer 302).

A buffer layer (not shown) may be disposed on the substrate 110. The buffer layer may be disposed entirely on the substrate 110. The buffer layer may prevent metal atoms or impurities from being diffused from the substrate 110, and may enable a substantially uniform active layer 130 to be obtained by adjusting the rate of heat transfer during crystallization process for forming the active layer 130. In addition, when a surface of the substrate 110 is not uniform, the buffer layer may serve to improve the flatness of the surface of the substrate 110. Depending on the type of the substrate 110, two or more buffer layers may be provided on the substrate 110, or the buffer layer may not be disposed. The buffer layer may include a silicon compounds, metal oxides, and the like.

The active layer 130 may be disposed on the lower substrate 110, and the active layer 130 may include a metal oxide semiconductor, an inorganic semiconductor (such as amorphous silicon and poly silicon), an organic semiconductor, and the like. The active layer 130 may have a source area and a drain area.

The gate insulating layer 150 may be disposed on the active layer 130. The gate insulating layer 150 may cover the active layer 130 and may be disposed on the substrate 110. For example, the gate insulating layer 150 sufficiently cover the active layer 130 and may have a substantially planar upper surface without generating a step around the active layer 130. Selectively, the gate insulating layer 150 may be disposed to have a uniform thickness along a profile of the active layer 130 while covering the active layer 130 on the substrate 110. The gate insulating layer 150 may include silicon compounds, metal oxides, and the like. For example, the gate insulating layer 150 may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), and the like. In other exemplary embodiments, the gate insulating layer 150 may have a multi-layer structure including a plurality of insulating layers. For example, the insulating layers may have different thicknesses or include different materials.

The gate electrode 170 may be disposed on a portion of the gate insulating layer 150 below which the active layer 130 is positioned. The gate electrode 170 may include a metal, an alloy, a metal nitride, a conductive metal oxide, a transparent conductive material, and the like. These may be used individually or in combination. In other exemplary embodiments, the gate electrode 170 may have a multi-layer structure including a plurality of metal layers. For example, the metal layers may have different thicknesses or include different materials.

An insulating interlayer 190 may be disposed on the gate electrode 170. The insulating interlayer 190 may cover the gate electrode 170 and may be disposed on the gate insulating layer 150. For example, the insulating interlayer 190 may sufficiently cover the gate electrode 170 on the gate insulating layer 150, and may have a substantially planar upper surface without generating a step around the gate electrode 170. Selectively, the insulating interlayer 190 may be disposed to have a uniform thickness along the profile of the gate electrode 170 while covering the gate electrode 170 on the gate insulating layer 150. The insulating interlayer 190 may include a silicon compounds, metal oxides, and the like. In other exemplary embodiments, the insulating interlayer 190 may have a multi-layer structure including a plurality of insulating layers. For example, the insulating layers may have different thicknesses or include different materials.

The source electrode 210 and the drain electrode 230 may be disposed on the insulating interlayer 190. The source electrode 210 and the drain electrode 230 may be connected to the source area and the drain area of the active layer 130 through contact holes formed by removing parts of the gate insulating layer 150 and the insulating interlayer 190, respectively. Each of the source electrode 210 and the drain electrode 230 may include a metal, an alloy, a metal nitride, a conductive metal oxide, a transparent conductive material, and the like. These may be used individually or in combination. In other exemplary embodiments, the source electrode 210 and the drain electrode 230 may have a multi-layer structure including a plurality of metal layers. For example, the metal layers may have different thicknesses or include different materials.

Accordingly, the semiconductor element 250, which includes the active layer 130, the gate insulating layer 150, the gate electrode 170, the insulating interlayer 190, the source electrode 210, and the drain electrode 230, may be disposed.

Although the semiconductor element 250 has been described as having an upper gate structure, the configuration of the inventive concepts is not limited thereto. For example, the semiconductor element 250 may have a bottom gate structure or a double gate structure.

The planarization layer 270 may be disposed on the source electrode 210 and the drain electrode 230. The planarization layer 270 may cover the source electrode 210 and the drain electrode 230. In exemplary embodiments, the planarization layer 270 may be disposed to have a relatively thick thickness to sufficiently cover the source electrode 210 and the drain electrode 230. In this case, the planarization layer 270 may have a substantially planar top surface, and a planarization process may be added to the planarization layer 270 to implement the above planar upper surface of the planarization layer 270. Selectively, the planarization layer 270 may be disposed to have a uniform thickness along profiles of the source electrode 210 and the drain electrode 230 while covering the source electrode 210 and the drain electrode 230. The planarization layer 270 may be formed of an organic material or an inorganic material. In exemplary embodiments, the planarization layer 270 may include an organic material such as photoresist, polyacryl-based resin, polyimide-based resin, polyamide-based resin, siloxane-based resin, acryl-based resin, and epoxy-based resin.

The lower electrode 290 may be disposed on the planarization layer 270. The lower electrode 290 may be connected to the drain electrode 230 through a contact hole formed by removing a part of the planarization layer 270. In addition, the lower electrode 290 may be electrically connected to the semiconductor element 250. The lower electrode 290 may include a metal, an alloy, a metal nitride, a conductive metal oxide, a transparent conductive material, and the like. These may be used individually or in combination. In other exemplary embodiments, the lower electrode 290 may have a multi-layer structure including a plurality of metal layers. For example, the metal layers may have different thicknesses or include different materials.

The pixel defining layer 310 may be disposed on the planarization layer 270, and may expose a part of the top surface of the lower electrode 290. The pixel defining layer 310 may be formed of an organic material or an inorganic material. In exemplary embodiments, the pixel defining layer 310 may include an organic material.

The light emitting layer 330 may be disposed on the lower electrode 290 which is at least partially exposed. The light emitting layer 330 may be formed using at least one of light emitting materials capable of emitting color lights (such as red light, green light, and blue light) that are different according to sub-pixels. On the contrary, the light emitting layer 330 may be formed by laminating a plurality of light emitting materials capable of generating different color light such as red light, green light and blue light, such that white light may be emitted as a whole. In this case, the color filter may be disposed on the light emitting layer 330. The color filter may include at least one of a red color filter, a green color filter, and a blue color filter. Selectively, the color filter also may include a yellow color filter, a cyan color filter, and a magenta color filter. The color filter may include photosensitive resin or color photoresist.

The upper electrode 340 may be disposed on the pixel defining layer 310 and the light emitting layer 330. The upper electrode 340 may include a metal, an alloy, a metal nitride, a conductive metal oxide, a transparent conductive material, and the like. In other exemplary embodiments, the upper electrode 340 may have a multi-layer structure including a plurality of metal layers. For example, the metal layers may have different thicknesses or include different materials.

The first inorganic thin film encapsulation layer 451 may be disposed on the upper electrode 340. The first inorganic thin film encapsulation layer 451 may be disposed to have a uniform thickness along a profile of the upper electrode 340 while covering the upper electrode 340. The first inorganic thin film encapsulation layer 451 may prevent the light emitting layer 330 from deteriorating due to the permeation of the moisture, oxygen, or the like. In addition, the first inorganic thin film encapsulation layer 451 may also function to protect the display panel 200 from the external impact. The first inorganic thin film encapsulation layer 451 may include flexible inorganic materials.

Accordingly, the pixel PX including the lower electrode 290, the light emitting layer 330, and the upper electrode 340 may be disposed.

The organic thin film encapsulation layer 452 may be disposed on the first inorganic thin film encapsulation layer 451. The organic thin film encapsulation layer 452 may improve the flatness of the display panel 200, and may protect the display panel 200. The organic thin film encapsulation layer 452 may include flexible organic materials.

The second inorganic thin film encapsulation layer 453 may be disposed on the organic thin film encapsulation layer 452. The second inorganic thin film encapsulation layer 453 may be disposed to have a uniform thickness along the profile of the organic thin film encapsulation layer 452 while covering the organic thin film encapsulation layer 452. The second inorganic thin film encapsulation layer 453 may prevent the light emitting layer 330 from deteriorating due to the permeation of the moisture, oxygen, or the like, together with the first inorganic thin film encapsulation layer 451. In addition, the second inorganic thin film encapsulation layer 453 may also function to protect the display panel 200 from the external impact, together with the first inorganic thin film encapsulation layer 451 and the organic thin film encapsulation layer 452. The second inorganic thin film encapsulation layer 453 may include flexible inorganic materials.

Accordingly, the display panel 200, which includes a substrate 110, a semiconductor element 250, a planarization layer 270, a pixel defining layer 310, a pixel PX, a first inorganic thin film encapsulation layer 451, an organic thin film encapsulation layer 452, and a second inorganic thin film encapsulation layer 453, may be disposed.

In other exemplary embodiments, when the substrate 110 includes a glass substrate, an encapsulation substrate may be disposed instead of the first inorganic thin film encapsulation layer 451, the organic thin film encapsulation layer 452, and the second inorganic thin film encapsulation layer 453. The encapsulation substrate may be disposed on the upper electrode 340, and may face the substrate 110. The encapsulation substrate may include substantially the same material as the substrate 110. For example, the encapsulation substrate may include a quartz substrate, a synthetic quartz substrate, a calcium fluoride substrate, a fluorine-doped (F-doped) quartz substrate, a soda-lime glass substrate, a non-alkali glass substrate, and the like.

Although the display device 100 of the inventive concepts has been described as an organic light emitting display device, the configuration of the inventive concepts is not limited thereto. In other exemplary embodiments, the display device 100 may include a liquid crystal display device (LCD), a field emission display (FED), a plasma display panel (PDP), or an electrophoretic display device (EPD).

Figure 7:
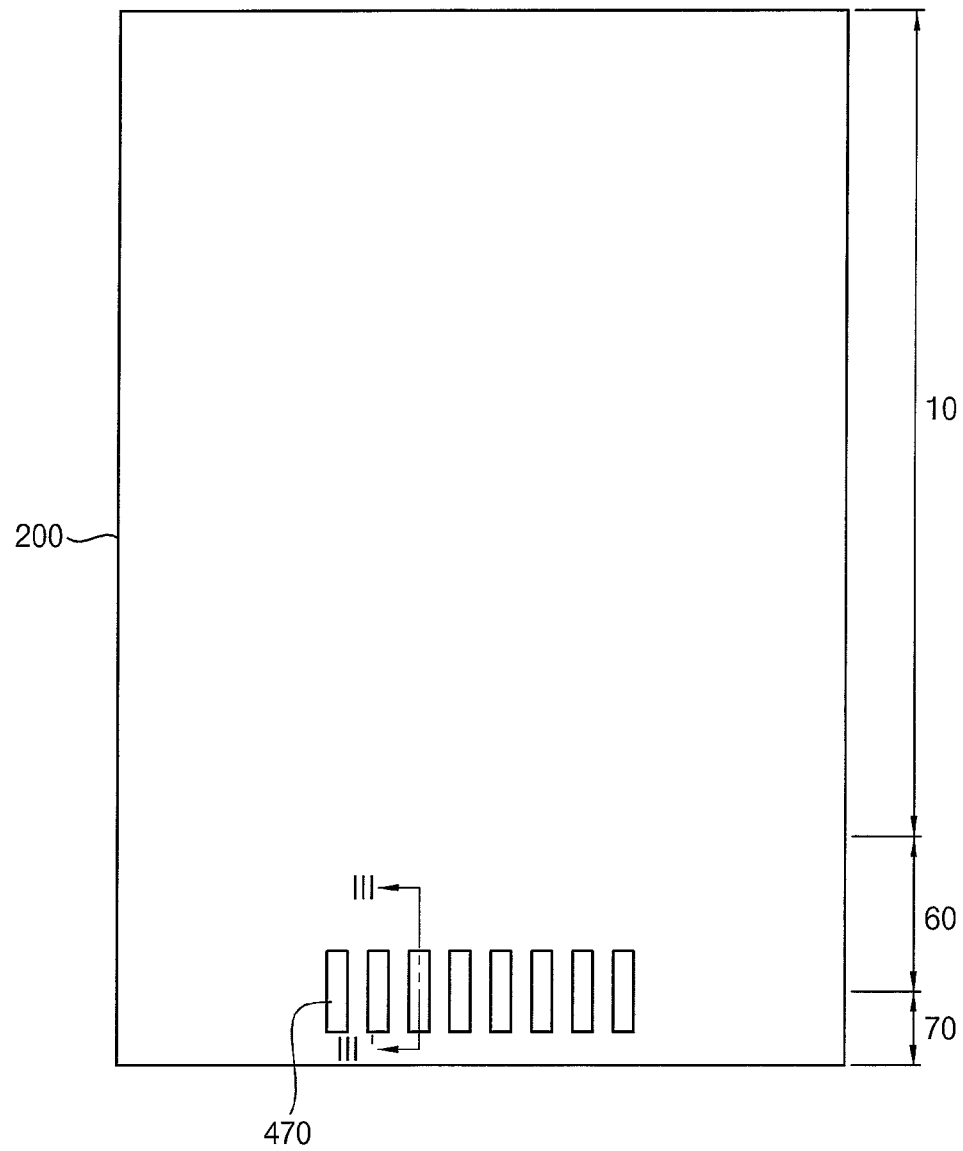
FIGS. 7, 8, 9, 10, 11, and 12 are views showing a method of manufacturing a display device according to exemplary embodiments of the inventive concepts.
Figure 8:
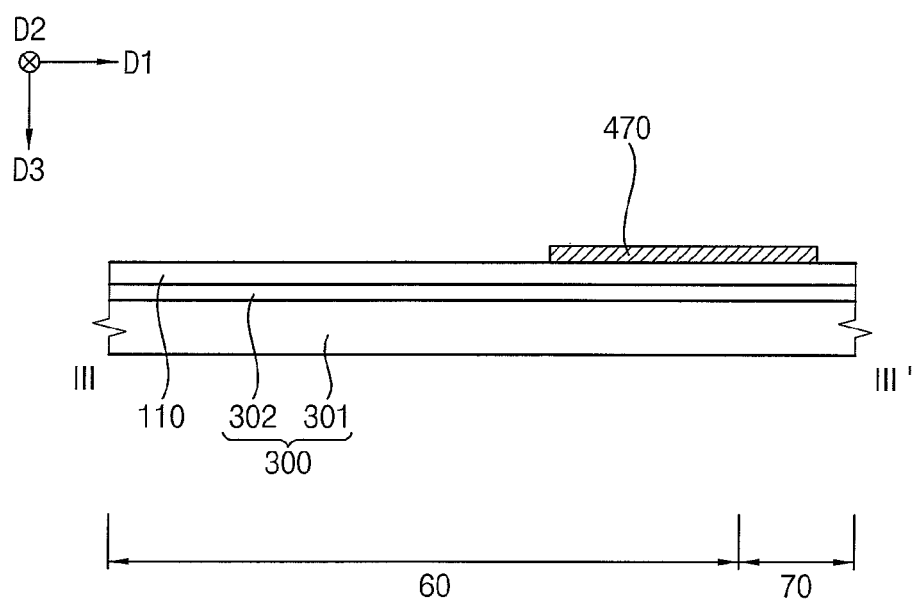
Figure 9:
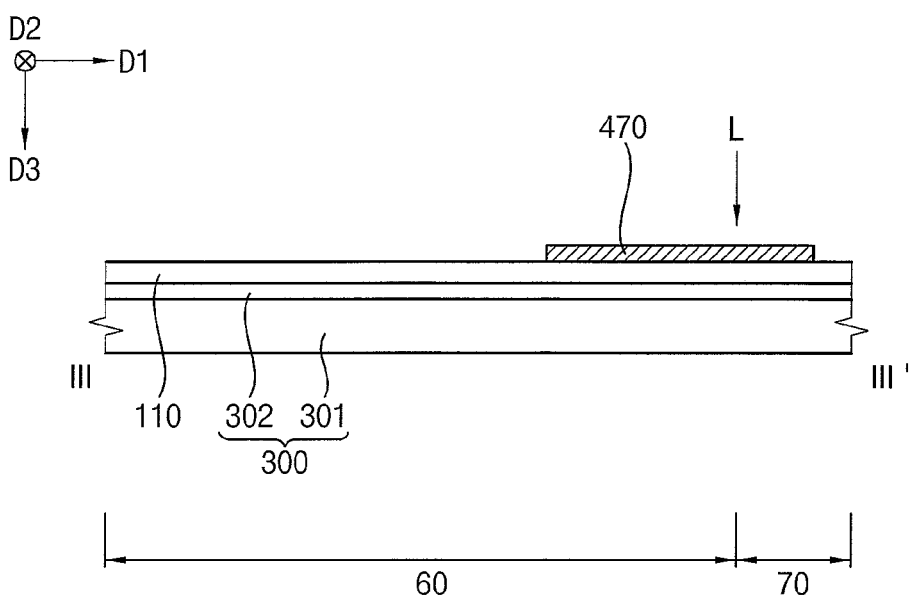

FIGS. 7, 8, 9, 10, 11, and 12 are views showing a method of manufacturing a display device according to exemplary embodiments of the inventive concepts. For example, FIG. 7 is a plan view showing the display device, and FIGS. 8 and 9 are cross-sectional views taken along line III-III' of FIG. 7.

Referring to FIGS. 6, 7 and 8, a hard glass substrate may be provided. A substrate 110 may be formed on the glass substrate. For example, since the substrate 110 is thin and flexible, the substrate 110 may be formed on the hard glass substrate to support the formation of an upper structure (such as the semiconductor element, the pixel PX, the pad electrode 470). For example, in the process of forming the upper structure, the semiconductor element 250, the planarization layer 270, the pixel defining layer 310, the pixel PX, the first inorganic thin film encapsulation layer 451, and the organic thin film encapsulation layer 452, the second inorganic thin film encapsulation layer 453, and the like may be formed in the first area 10 on the substrate 110 (see FIG. 6). In addition, the pad electrode 470 may be formed in the third area 60 on the substrate 110. In exemplary embodiments, the pad electrode 470 may be disposed in a part of the third area 60 and a part of the second area 70 on the substrate 110. The pad electrode 470 may include a metal, an alloy, a metal nitride, a conductive metal oxide, a transparent conductive material, and the like. For example, the pad electrode 470 may be formed by using Au, Ag, Al, Pt, Ni, Ti, Pd, Mg, Ca, Li, Cr, Ta, W, Cu, Mo, Sc, Nd, Ir, an alloy containing aluminum, AlN, an alloy containing silver, WN, an alloy containing copper, an alloy containing molybdenum, TiN, CrN, TaN, SrRuO, ZnO, ITO, SnO, InO, GaO, IZO, and the like These may be used individually or in combination.

After the upper structure is formed on the substrate 110, the glass substrate may be removed. The substrate 110 may be formed using a transparent resin substrate having flexibility.

Accordingly, the display panel 200, which includes the substrate 110, the semiconductor element 250, the planarization layer 270, the pixel defining layer 310, the pixel PX, the first inorganic thin film encapsulation layer 451, the organic thin film encapsulation layer 452, the second inorganic thin film encapsulation layer 453, and the pad electrode 470, may be formed.

The protective film 300 may be formed on the bottom surface of the substrate 110 (for example, the bottom surface of the display panel 200). The protective film 300 may include a protective layer 301 and an adhesive layer 302, and may be divided into a first area 10, a second area 70 and a third area 60. The adhesive layer 302 may be disposed between the substrate 110 and the protective layer 301. The adhesive layer 302 may bond the substrate 110 to the protective layer 301. The protective layer 301 may be formed using PET, PEN, PP, PC, PS, PSU, PE, PPA, PES, PAR, PCO, MPPO, PI, and the like. The adhesive layer 302 may be formed using OCA, PSA or the like including an acrylic-based adhesive, a silicone-based adhesive, a urethane-based adhesive, a rubber-based adhesive, a vinyl ether-based adhesive, and the like. In exemplary embodiments, the substrate 110 may be positioned in the first area 10, the second area 70, and the third area 60 on the protective film 300. In other words, the substrate 110 may be positioned over the entire portion of the protective film 300.

Referring to FIG. 9, laser L may be irradiated along the boundary between the second area 70 and the third area 60 on the pad electrode 470. For example, the laser L may be irradiated at a relatively high speed along the boundary with a relatively low power.

Figure 10:
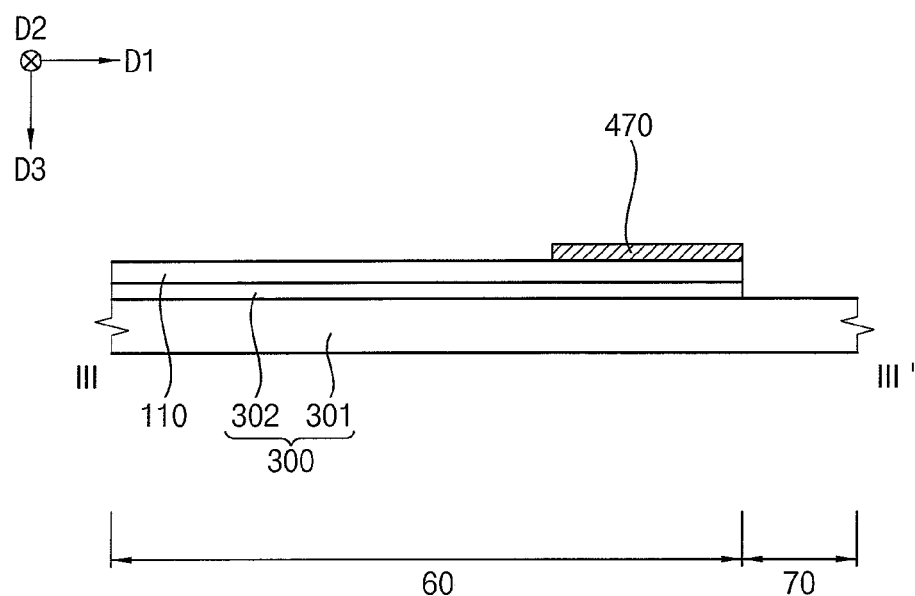

Referring to FIG. 10, after the laser L is irradiated along the boundary on the pad electrode 470, the adhesive layer 302 positioned in the second area 70 and the display panel 200 positioned in the second area 70 (for example, the substrate 110 and the pad electrode 470) may be removed. In other words, after the adhesive layer 302 positioned in the second area 70 and the substrate 110 and pad electrode 470 positioned in the second area 70 are removed, the top surface of the protective layer 301 positioned in the second area 70 may be exposed.

Figure 11:
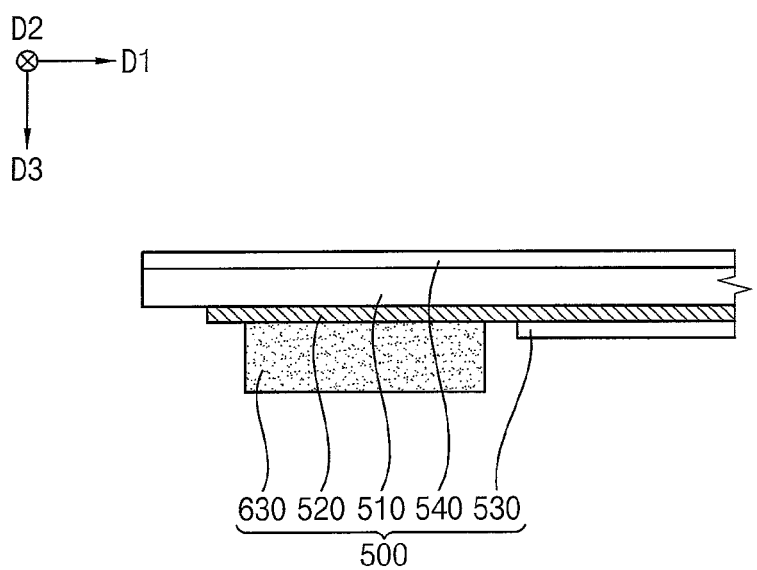

Referring to FIGS. 3 and 11, the base substrate 510 may be provided. The base substrate 510 may be formed using a flexible film including PI, acrylic, polyethernitrile, PES, PET, PEN, PVC, and the like.

The driving integrated circuit 550 configured to control the driving of the display panel 200 may be formed in a central portion on the bottom surface of the base substrate 510.

An upper bump electrode 521 may be formed on the bottom surface of the base substrate 510 along a direction opposite to the first direction D1 from the first side surface of the driving integrated circuit 550, and a lower bump electrode 522 may be formed along the first direction D1 from the second side surface of the driving integrated circuit 550.

Accordingly, the bump electrode 520 including the upper bump electrode 521 and the lower bump electrode 522 may be formed. The bump electrode 520 may be formed by using a metal, an alloy, a metal nitride, a conductive metal oxide, a transparent conductive material, or the like. These may be used individually or in combination. For example, the bump electrode 520 shown in FIG. 11 may correspond to the upper bump electrode 521.

The first protective insulating layer 530 may be formed on the base substrate 510 to cover a part of the bump electrode 520. For example, a first portion of the upper bump electrode 521 may be exposed by the first protective insulating layer 530, a second portion of the upper bump electrode 521 may be covered by the first protective insulating layer 530, and the second portion of the upper bump electrode 521 may be connected to the first side surface of the driving integrated circuit 550. In addition, a first portion of the lower bump electrode 522 may be exposed by the first protective insulating layer 530, a second portion of the lower bump electrode 522 may be covered by the first protective insulating layer 530, and the second portion of the lower bump electrode 522 may be connected to the second side surface of the driving integrated circuit 550. The first protective insulating layer 530 may include solder resist.

A second protective insulating layer 540 may be formed on the base substrate 510. The second protective insulating layer 540 may protect the top surface of the base substrate 510. The second protective insulating layer 540 may be formed using substantially the same material as the first protective insulating layer 530.

An uncured conductive layer 630 may be positioned on the first portion of the bump electrode 520. The uncured conductive layer 630 may include conductive balls therein. The conductive layer 630 may be formed using epoxy resin, amino resin, phenol resin, urea resin, melamine resin, unsaturated polyester resin, polyurethane resin, polyimide resin, and the like. Each of the conductive balls may have a structure in which a spherical polymer is coated with a metal layer such as Ni, Co, Au, Ag, or Cu.

Accordingly, the conductive film package 500, which includes the base substrate 510, the bump electrode 520, the first protective insulating layer 530, the second protective insulating layer 540, the uncured conductive layer 630, and the driving integrated circuit 550, may be provided.

Figure 12:
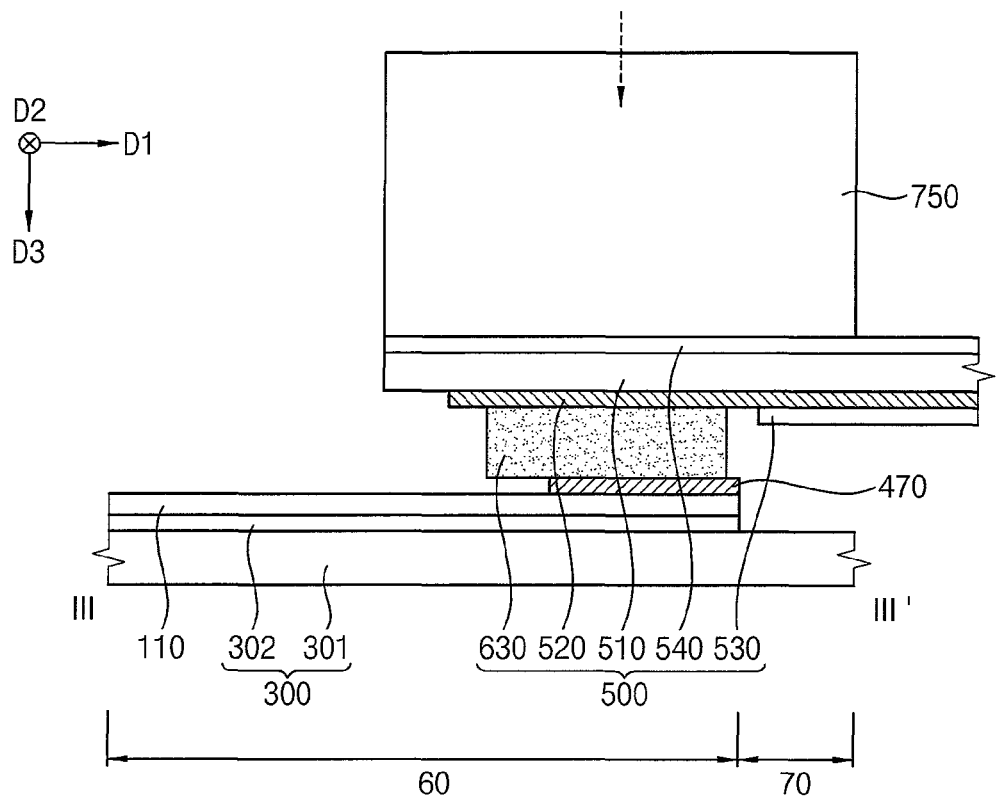

Referring to FIGS. 5 and 12, the uncured conductive layer 630 may be positioned on the pad electrode 470, such that the first portion of the bump electrode 520 overlaps the pad electrode 470. In other words, the uncured conductive layer 630 may be in contact with the pad electrode 470, such that a part of the conductive film package 500 overlaps the part of the third area 60 and the display panel 200 positioned in the second area 70.

A heating member 750 may be in contact with the top surface of the conductive film package 500. The heating member 750 may be heated to a predetermined temperature, and may apply pressure onto the conductive film package 500 in the third direction D3. In this case, as a gap between the bump electrode 520 and the pad electrode 470 becomes narrow due to the pressure, the uncured conductive layer 630 may reflow in the first direction D1 and in a direction opposite to the first direction D1 (for example, a fourth direction D4 of FIG. 13), and the uncured conductive layer 630 may be cured due to the heat.

As the gap narrows, shapes of the conductive balls positioned between the bump electrode 520 and the pad electrode 470 may be transformed from a circular plane shape to an oval plane shape. At least a part of each of the conductive balls may be exposed from the conductive layer 630 between the pad electrode 470 and the bump electrode 520, and the exposed portion of each of the conductive balls may be in direct contact with the bump electrode 520 and the pad electrode 470.

After the curing process is performed, the heating member 750 may be spaced apart from the top surface of the conductive film package 500.

Accordingly, the display device 100 shown in FIG. 5 may be manufactured.

In the method of manufacturing the display device according to the exemplary embodiments of the inventive concepts, since the adhesive layer 302, the substrate 110, and the pad electrode 470 are removed from the second area 70 on the protective layer 301, the pad electrode 470 may be spaced apart from the first protective insulating layer 530, and an empty space may be defined between the pad electrode 470 and the first protective insulating layer 530. While the heating member 750 applies pressure onto the conductive film package 500 in the third direction D3 and thus the uncured conductive layer 630 reflows, the uncured conductive layer 630 may pass through the empty space defined between the pad electrode 470 and the first protective insulating layer 530 and be formed on the protective layer 301 positioned in the second area 70. In other words, while the uncured conductive layer 630 reflows, the pressure may not increase between the pad electrode 470 and the bump electrode 520 due to the empty space. Accordingly, the cracks may not be generated in the substrate 110, and the defective adhesion may not occur between the conductive film package 500 and the display panel 200.

Figure 13:
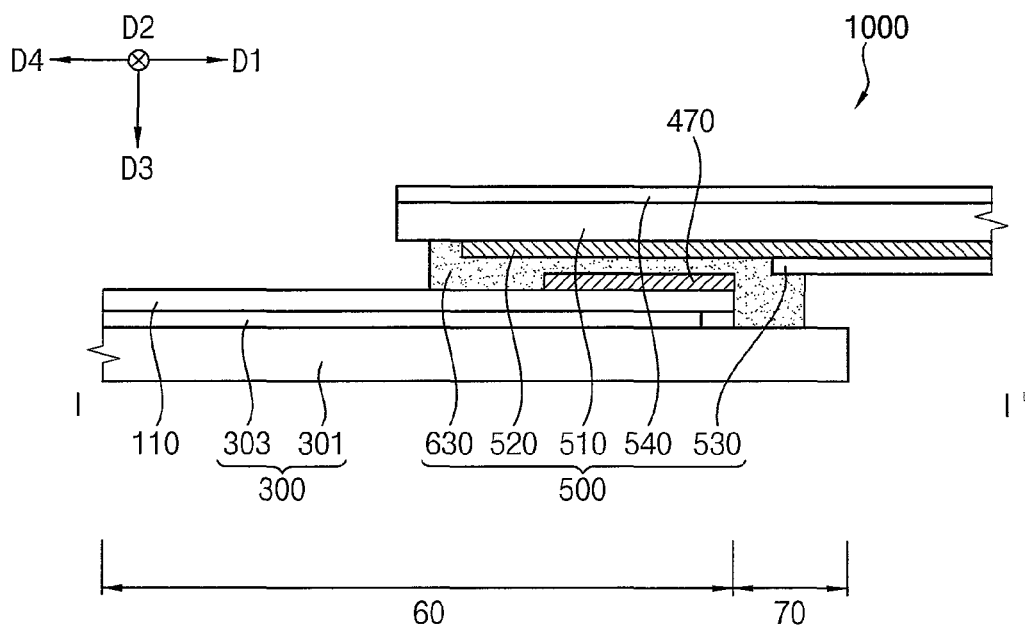
FIG. 13 is a cross-sectional view showing a display device according to exemplary embodiments of the inventive concepts.

FIG. 13 is a sectional view showing the display device according to exemplary embodiments of the inventive concepts. The display device 1000 illustrated in FIG. 13 may have a configuration substantially the same as or similar to the display device 100 described with reference to FIGS. 1 to 6, except for an adhesive layer 303. In FIG. 13, duplicate descriptions for components substantially the same as or similar to the components described with reference to FIGS. 1 to 6 will be omitted. For example, FIG. 13 is a sectional view taken along line I-I' of FIG. 1.

Referring to FIG. 13, the display device 1000 may include a display panel 200, a protective film 300, a conductive film package 500, and the like. The display panel 200 may include a substrate 110, a pad electrode 470 and the like. The protective film 300 may include a protective layer 301 and an adhesive layer 303. In addition, the conductive film package 500 may include a base substrate 510, a bump electrode 520, a first protective insulating layer 530, a second protective insulating layer 540, a conductive layer 630 and a driving integrated circuit 550. The bump electrode 520 may include an upper bump electrode 521 and a lower bump electrode 522.

The adhesive layer 303 may be disposed in the first area 10 and a part of the third area 60 on the protective layer 301. In other words, the adhesive layer 303 may be disposed in the first area 10 and a part of the third area 60 between the protective layer 301 and the substrate 110. The adhesive layer 303 may bond the substrate 110 to the protective layer 301. In exemplary embodiments, the adhesive layer 303 may expose a part of the top surface of the protective layer 301 positioned in the third area 60 and a part of the bottom surface of the substrate 110. In other words, one side surface of the pad electrode 470 and one side surface of the substrate 110 may be aligned with the boundary between the third area 60 and the second area 70, but one side surface of the adhesive layer 303 may be positioned spaced apart from the boundary in the fourth direction D4. In other words, an empty space, which is defined by the side surface of the adhesive layer 303, the bottom surface of the substrate 110, and the top surface of the protective layer 301, may be generated. In addition, the adhesive layer 303 may not be disposed in the second area 70 on the protective layer 301, and may expose the protective layer 301 positioned in the second area 70. The adhesive layer 303 may include OCA, PSA or the like including an acrylic-based adhesive, a silicone-based adhesive, a urethane-based adhesive, a rubber-based adhesive, a vinyl ether-based adhesive, and the like.

The conductive layer 630 may be disposed between the first portion of the bump electrode 520 and the pad electrode 470, and the conductive layer 630 may cover the first portion of the bump electrode 520. In exemplary embodiments, the conductive layer 630 may be in direct contact with a part of the bottom surface of the base substrate 510 positioned overlapping the third area 60, the first portion of the bump electrode 520, and a part of the first protective insulating layer 530 overlapped in the second area 70 so as to prevent the first portion of the bump electrode 520 from being exposed. In addition, the conductive layer 630 may be in contact with the top surface of the protective layer 301 that overlaps the second area 70. In addition, the conductive layer 630 may be in direct contact with the side surface of the pad electrode 470 and the side surface of the substrate 110 at the boundary between the second area 70 and the third area 60. The conductive layer 630 may be spaced apart from the side surface of the adhesive layer 303. In other exemplary embodiments, the conductive layer 630 may be filled in the empty space, and the conductive layer 630 may be in contact with the side surface of the adhesive layer 303, the bottom surface of the substrate 110 and the top surface of the protective layer 301.

The conductive film package 500 may be bonded to the display panel 200 by the conductive layer 630. The conductive layer 630 may include thermosetting resin or photocurable resin. For example, the conductive layer 630 may include epoxy resin, amino resin, phenol resin, urea resin, melamine resin, unsaturated polyester resin, polyurethane resin, polyimide resin, and the like.

The display device 1000 according to the exemplary embodiments of the inventive concepts may include an empty space, which is defined by the side surface of the adhesive layer 303, the bottom surface of the substrate 110, and the top surface of the protective layer 301, at a portion adjacent to the boundary between the second area 70 and the third area 60. Accordingly, since the adhesive layer 303 is not disposed in the second area 70, the display panel 200 (for example, the substrate 110 and the pad electrode 470) positioned in the second area 70 may be easily removed during manufacturing the display device 1000.

Figure 14:
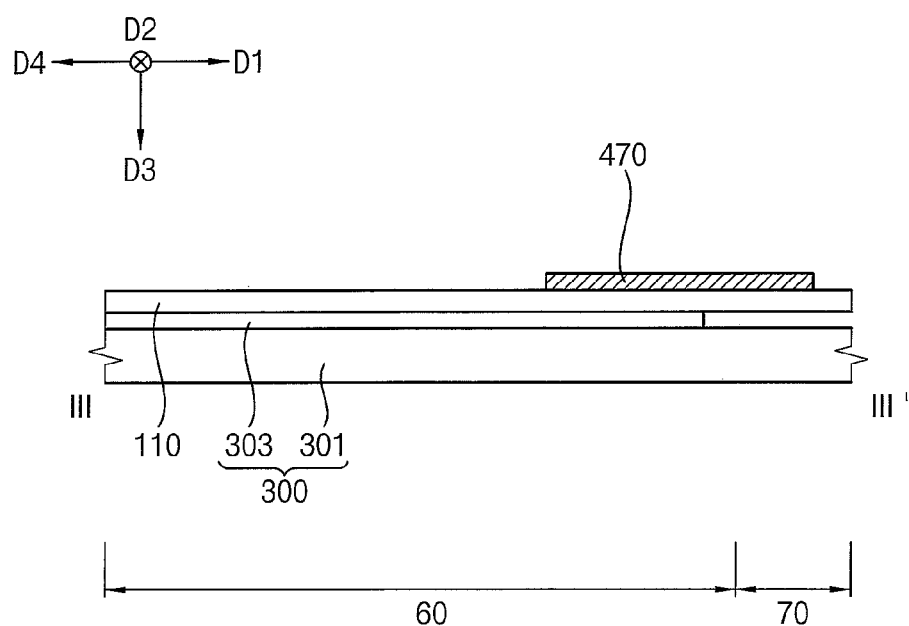
FIGS. 14, 15, 16, and 17 are views showing a method of manufacturing the display device according to exemplary embodiments of the inventive concepts.
Figure 15:
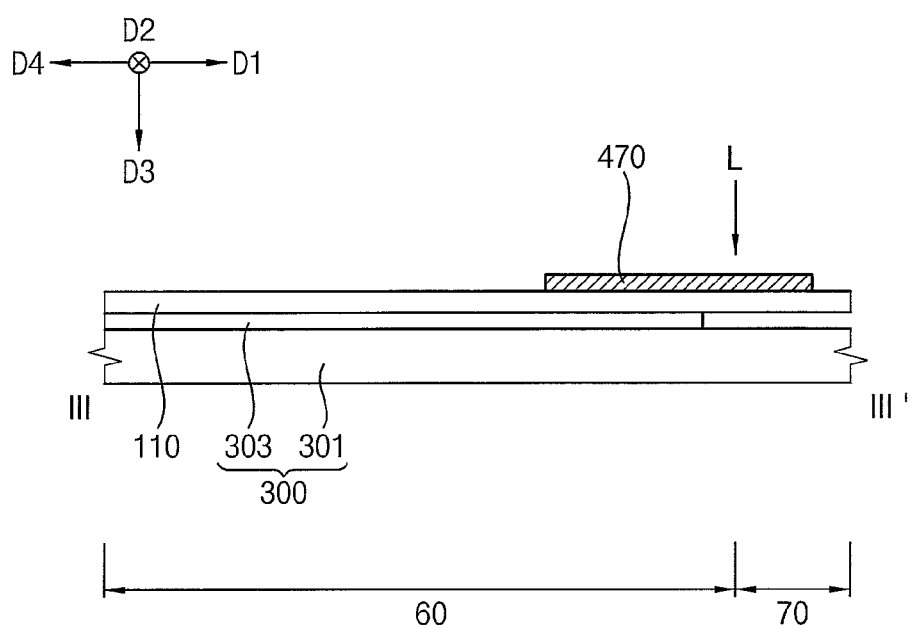
Figure 16:
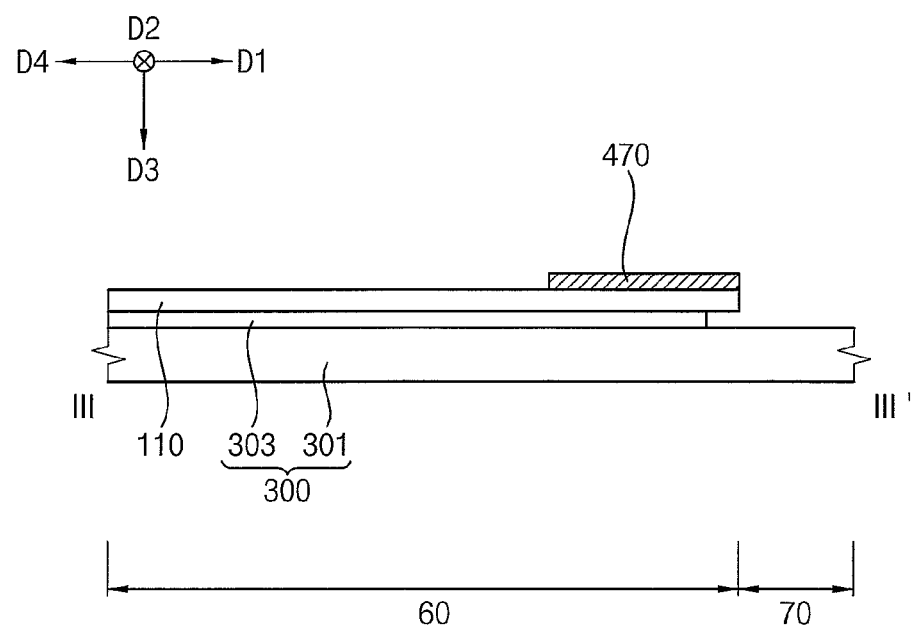

FIGS. 14, 15, 16, and 17 are views showing a method of manufacturing the display device according to exemplary embodiments of the inventive concepts. The method of manufacturing the display device illustrated in FIGS. 14 to 17 may be substantially the same as or similar to the method of manufacturing the display device described with reference to FIGS. 7 to 12, except for an adhesive layer 303. In FIGS. 14 to 17, duplicate descriptions for the manufacturing method substantially the same as or similar to the manufacturing method described with reference to FIGS. 7 to 12 will be omitted. For example, FIG. 13 is a sectional view taken along line I-I' of FIG. 1. For example, FIGS. 14 and 15 are sectional views taken along line III-III' of FIG. 7.

Referring to FIGS. 6, 7 and 14, the display panel 200, which includes the substrate 110, the semiconductor element 250, the planarization layer 270, the pixel defining layer 310, the pixel PX, the first inorganic thin film encapsulation layer 451, the organic thin film encapsulation layer 452, the second inorganic thin film encapsulation layer 453, and the pad electrode 470, may be provided.

A protective film 300, which may be divided into a first area 10, a second area 70, and a third area 60, may be provided. For example, the protective film 300 may include a protective layer 301 and an adhesive layer 303, and the adhesive layer 303 may be formed in the first area 10 and a part of the third area 60 on the protective layer 301. In other words, the adhesive layer 303 may expose a part of the top surface of the protective layer 301 positioned in the third area 60 and the top surface of the protective layer 301 positioned in the second area 70. The protective layer 301 may be formed using PET, PEN, PP, PC, PS, PSU, PE, PPA, PES, PAR, PCO, MPPO, PI, and the like. The adhesive layer 303 may be formed using OCA, PSA or the like including an acrylic-based adhesive, a silicone-based adhesive, a urethane-based adhesive, a rubber-based adhesive, a vinyl ether-based adhesive, and the like.

A protective film 300, which includes an adhesive layer 303 patterned on the protective layer 301, may be formed on the bottom surface of the substrate 110 (for example, the bottom surface of the display panel 200). In exemplary embodiments, the adhesive layer 303 may be disposed in the first area 10 and a part of the third area 60 between the protective layer 301 and the substrate 110, and may bond the substrate 110 to the protective layer 301. In addition, the adhesive layer 303 may be expose the top surface of the protective layer 301 positioned in the second area 70 and a part of the third area 60, and the bottom surface of the substrate 110 positioned in the second area 70 and a part of the third area 60. In other words, one side surface of the adhesive layer 303 may be positioned spaced apart from the boundary in the fourth direction D4. In other words, an empty space, which is defined by the side surface of the adhesive layer 303, the bottom surface of the substrate 110, and the top surface of the protective layer 301, may be generated.

Referring to FIG. 15, laser L may be irradiated along the boundary between the second area 70 and the third area 60 on the pad electrode 470. For example, the laser L may be irradiated at a relatively high speed along the boundary with a relatively low power.

Referring to FIG. 10, after the laser L is irradiated along the boundary on the pad electrode 470, the display panel 200 (for example, the substrate 110 and the pad electrode 470) positioned in the second area 70 may be removed. In other words, the substrate 110 and the pad electrode 470 positioned in the second area 70 are removed, so that the top surface of the protective layer 301 positioned in the second area 70 may be exposed.

In this case, since the adhesive layer 303 is not formed in the second area 70 and the part of the third area 60 on the protective layer 301, the substrate 110 and the protective layer 301 positioned in the second area 70 may not be bonded by the adhesive layer 303. Accordingly, in the process of irradiating the laser L along the boundary on the pad electrode 470, the substrate 110 and the pad electrode 470 positioned in the second area 70 may be easily removed.

Referring to FIG. 11, the conductive film package 500, which includes the base substrate 510, the bump electrode 520, the first protective insulating layer 530, the second protective insulating layer 540, the uncured conductive layer 630, and the driving integrated circuit 550, may be provided.

Figure 17:
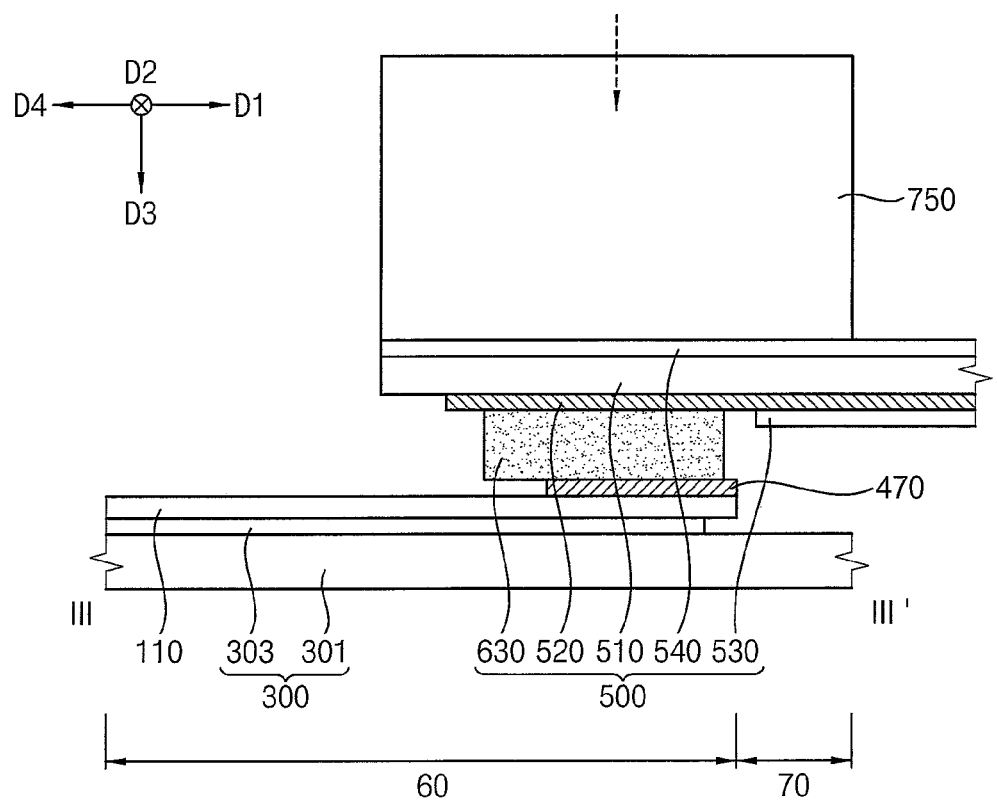

Referring to FIGS. 13 and 17, the uncured conductive layer 630 may be positioned on the pad electrode 470, such that the first portion of the bump electrode 520 overlaps the pad electrode 470. In other words, the uncured conductive layer 630 may be in contact with the pad electrode 470, such that a part of the conductive film package 500 overlaps the part of the third area 60 and the display panel 200 positioned in the second area 70.

The heating member 750 may be in contact with the top surface of the conductive film package 500. The heating member 750 may be heated to a preset temperature and may apply pressure onto the conductive film package 500 in the third direction D3. In this case, as a gap between the bump electrode 520 and the pad electrode 470 becomes narrow due to the pressure, the uncured conductive layer 630 may reflow in the first direction D1 and the fourth direction D4, and the uncured conductive layer 630 may be cured due to the heat.

As the gap narrows, shapes of the conductive balls positioned between the bump electrode 520 and the pad electrode 470 may be transformed from a circular plane shape to an oval plane shape. At least a part of each of the conductive balls may be exposed from the conductive layer 630 between the pad electrode 470 and the bump electrode 520, and the exposed portion of each of the conductive balls may be in direct contact with the bump electrode 520 and the pad electrode 470.

After the curing process is performed, the heating member 750 may be spaced apart from the top surface of the conductive film package 500.

Accordingly, the display device 1000 shown in FIG. 13 may be manufactured.

In the method of manufacturing the display device according to the exemplary embodiments of the inventive concepts, since the adhesive layer 303 is not formed in the second area 70 and the part of the third area 60 on the protective layer 301, the substrate 110 and the protective layer 301 positioned in the second area 70 may not be bonded by the adhesive layer 303. Accordingly, the substrate 110 and the pad electrode 470 positioned in the second area 70 may be easily removed.

In addition, since the substrate 110 and the pad electrode 470 are removed from the second area 70 on the protective layer 301, the pad electrode 470 may be spaced apart from the first protective insulating layer 530, and an empty space may be defined between the pad electrode 470 and the first protective insulating layer 530. While the heating member 750 applies pressure onto the conductive film package 500 in the third direction D3 and thus the uncured conductive layer 630 reflows, the uncured conductive layer 630 may pass through the empty space defined between the pad electrode 470 and the first protective insulating layer 530 and be formed on the protective layer 301 positioned in the second area 70. In other words, while the uncured conductive layer 630 reflows, the pressure may not increase between the pad electrode 470 and the bump electrode 520 due to the empty space. Accordingly, cracks may not be generated in the substrate 110, and defective adhesion may be avoided between the conductive film package 500 and the display panel 200.

The inventive concepts may be applied to various electronic devices including a display device. For example, the inventive concepts may be applied to vehicle-display device, a ship-display device, an aircraft-display device, portable communication devices, display devices for display or for information transfer, a medical-display device, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a protective film having a first area, a second area, and a third area positioned between the first area and the second area;
a display panel disposed in the first area and the third area on the protective film; and
a conductive film package disposed on the display panel, the conductive film package being in contact with the protective film disposed in the second area,
wherein the protective film includes:
a protective layer overlapping the first, second, and third areas; and
an adhesive layer disposed in the first and third areas between the protective layer and the display panel and not disposed in the second area,
wherein the display panel includes:
a substrate overlapping the first and third areas;
a pixel disposed in the first area on the substrate; and
a pad electrode disposed in the third area on the substrate, and
wherein the adhesive layer exposes a part of a top surface of the protective layer and a part of a bottom surface of the substrate positioned in the third area.

2. The display device of claim 1, wherein the display panel is not disposed in the second area.

3. The display device of claim 1, wherein the pad electrode does not overlap the protective film positioned in the second area.

4. The display device of claim 1, wherein one side surface of the pad electrode is aligned with a boundary between the second area and the third area.

5. The display device of claim 1, wherein one side surface of the pad electrode, one side surface of the substrate, and one side surface of the adhesive layer are aligned with a boundary between the second area and the third area.

6. The display device of claim 1, wherein one side surface of the pad electrode and one side surface of the substrate are aligned with a boundary between the second area and the third area, and one side surface of the adhesive layer is spaced apart from the boundary in a direction from the second area to the third area.

7. A display device comprising:
a protective film having a first area, a second area, and a third area positioned between the first area and the second area;
a display panel disposed in the first area and the third area on the protective film; and
a conductive film package disposed on the display panel, the conductive film package being in contact with the protective film disposed in the second area,
wherein the protective film includes:
a protective layer overlapping the first, second, and third areas; and an adhesive layer disposed in the first and third areas between the protective layer and the display panel and not disposed in the second area,
wherein the display panel includes:
a substrate overlapping the first and third areas;
a pixel disposed in the first area on the substrate; and
a pad electrode disposed in the third area on the substrate, and
wherein the conductive film package includes:
a base substrate disposed on the pad electrode;
a bump electrode disposed on a bottom surface of the base substrate to overlap the pad electrode;
a protective insulating layer disposed on a bottom surface of the bump electrode to expose a first portion of the bump electrode; and
a conductive layer disposed between the first portion of the bump electrode and the pad electrode.

8. The display device of claim 7, wherein the first portion of the bump electrode is portioned to overlap the third area and a part of the second area.

9. The display device of claim 7, wherein the conductive layer covers the first portion of the bump electrode.

10. The display device of claim 7, wherein the conductive layer is in contact with a side surface of the pad electrode, a side surface of the substrate, and a side surface of the adhesive layer at a boundary between the second area and the third area.

11. The display device of claim 7, wherein the protective insulating layer is spaced apart from the pad electrode and the protective layer positioned in the second area, and the conductive layer is disposed in a space where the protective insulating layer is spaced apart from the pad electrode and protective layer.

12. The display device of claim 7, wherein the conductive layer is in contact with a part of the protective insulating layer overlapping the second area and a top surface of the protective layer overlapping the second area.

13. The display device of claim 7, wherein the conductive layer is in contact with a side surface of the pad electrode and a side surface of the substrate at a boundary between the second area and the third area, and the conductive layer is spaced apart from a side surface of the adhesive layer.

14. The display device of claim 7, wherein the conductive film package further includes a driving integrated circuit disposed on a bottom surface of the base substrate and connected to the bump electrode.

* * * * *